(12) United States Patent
Ko

(10) Patent No.: US 7,524,721 B2
(45) Date of Patent: Apr. 28, 2009

(54) HIGH VOLTAGE CMOS DEVICE AND METHOD OF FABRICATING THE SAME

(75) Inventor: Kwang Young Ko, Boocheon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 11/842,810

(22) Filed: Aug. 21, 2007

(65) Prior Publication Data

US 2008/0150034 A1    Jun. 26, 2008

(30) Foreign Application Priority Data

Dec. 26, 2006   (KR) ...................... 10-2006-0134236

(51) Int. Cl.
*H01L 21/8238* (2006.01)
(52) U.S. Cl. .................. 438/225; 257/E21.12
(58) Field of Classification Search ................ 438/222, 438/225, 226, 297, 301, 362, 369, 373, 439, 438/450, 480, 481; 257/647, E21.545, E21.552, 257/E21.12
See application file for complete search history.

(56) References Cited

U.S. PATENT DOCUMENTS 6,350,641 B1 *   2/2002  Yang ........................... 438/227

\* cited by examiner

*Primary Examiner*—David Vu
(74) *Attorney, Agent, or Firm*—Saliwanchik, Lloyd & Saliwanchik

(57) ABSTRACT

A method of fabricating a high voltage CMOS device is provided that does not require a separate mask for forming a photo align key when forming a high voltage deep well region. The method includes forming a relatively thick first oxide film pattern exposing a predetermined region of a semiconductor substrate; forming a second oxide film pattern on the exposed semiconductor substrate; and forming a high voltage deep well region by performing an ion implant and an annealing using the first oxide film pattern as a mask. The second oxide film pattern is diffused by means of the annealing to generate a step on the high voltage deep well region. The step can be used as a photo align key.

9 Claims, 4 Drawing Sheets

HIGH VOLTAGE CMOS DEVICE AND METHOD OF FABRICATING THE SAME

CROSS-REFERENCE TO RELATED APPLICATION

The present application claims the benefit under 35 U.S.C. § 119 of Korean Patent Application No. 10-2006-0134236, filed Dec. 26, 2006, which is hereby incorporated by reference in its entirety.

BACKGROUND

FIGS. 1A to 1F are process views showing a method of fabricating a high voltage CMOS device in the related art.

Referring to FIG. 1A, a pad oxide film 2 is thinly formed on a semiconductor substrate 1 doped with impurity ions. The pad oxide film 2 is typically formed at a thickness of 200 Å to 300 Å.

Referring to FIG. 1B, in order to form a photoresist pattern for forming a high voltage deep well as will be described below, a mask is formed on the pad oxide film 2. Then, a photo align key 3 is formed by etching a portion region of the surface of the semiconductor substrate 1, including the pad oxide film 2, by using the mask.

Referring to FIG. 1C, a photoresist pattern P1 is aligned based on the photo align key 3 and is then formed on the pad oxide film 2.

Referring to FIG. 1D, a high voltage deep well region 4 is formed by doping impurity ions on the substrate using the photoresist pattern P1 as the mask, and then the photoresist pattern P1 is stripped.

Referring to FIG. 1E, an isolation region 5 is formed in a predetermined region of the semiconductor substrate 1 by removing the pad oxide film 2 and performing a LOCOS process.

Referring to FIG. 1F, a logic well region 6 is formed by implanting the impurity ions into the deep well region 4 of the semiconductor substrate 1 in which the isolation region 5 is formed.

A gate oxide film and polysilicon doped with impurity ions are stacked and patterned on the semiconductor substrate 1.

Thereafter, a spacer is formed on the sides of the gate oxide film and the polysilicon by forming an insulating film and performing a blanket etch thereon. The gate oxide film, the polysilicon and the spacer are collectively referred to as a 'gate structure 7.'

A source and drain region 8 are formed by implanting impurity ions using the gate structure 7 as an implantation mask.

The method of fabricating the high voltage CMOS device in the related art involves the process forming the mask for generating the photo align key on the semiconductor substrate so as to form the photoresist pattern for forming the high voltage deep well region. Since the mask does not perform other functions other than the function of generating the photo align key, other masks should be added. As a result, the process is complicated and manufacturing cost is increased.

BRIEF SUMMARY

Embodiments of the present invention provide a high voltage CMOS device and a method of fabricating the same capable of simplifying a manufacturing process and reducing manufacturing cost by not requiring a separate mask for forming a photo align key.

A method of fabricating a high voltage CMOS device according to one embodiment includes forming a first oxide film pattern on a semiconductor substrate exposing a predetermined region of the semiconductor substrate; forming a second oxide film pattern on the exposed semiconductor substrate; and forming a high voltage deep well region by performing an ion implant and an annealing using the first oxide film pattern as a mask, wherein the second oxide film pattern is diffused by means of the annealing to generate a step structure on the high voltage deep well region.

A high voltage CMOS device according to an embodiment includes: a semiconductor substrate; a high voltage deep well region formed to have a step structure on the semiconductor substrate; a logic well region formed in the high voltage deep well region; an isolation region formed on the semiconductor substrate; a spacer formed in a step generating region of the step structure; a gate structure formed on the semiconductor substrate; and a source and drain region formed on the semiconductor substrate at the sides of the gate structure.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Hereinafter, embodiments of the present invention will be described with reference to the accompanying drawings.

With reference to the description of the embodiments, when a layer (film), a region, a pattern, or a structure is described as being formed "on/above/over/under" or "down/below/under/lower" a substrate, layer (film), region, pad, or pattern, it can be construed as the case where each layer (film), region, pad, pattern, or structure is formed to be directly contacted to each layer (film), region, pad, or pattern, or can be construed to mean the case where they are formed with other layers (film), regions, other pads, other patterns, or other structures interposed therebetween.

FIGS. 2A to 2F are process views showing a method of fabricating a high voltage CMOS device according to an embodiment of the present invention.

Figure 1A:
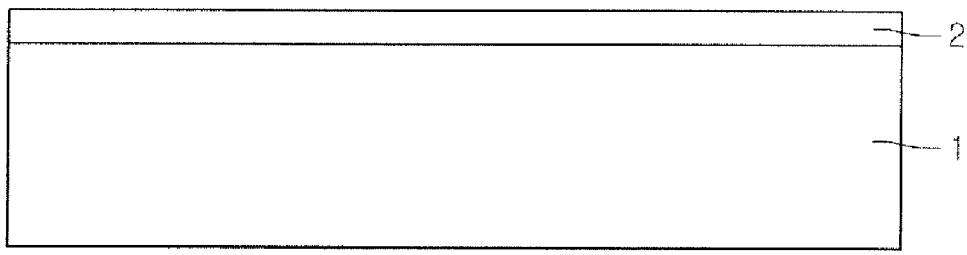
FIGS. 1A to 1F are process views showing a method of fabricating a high voltage CMOS device in the related art.
Figure 1B:
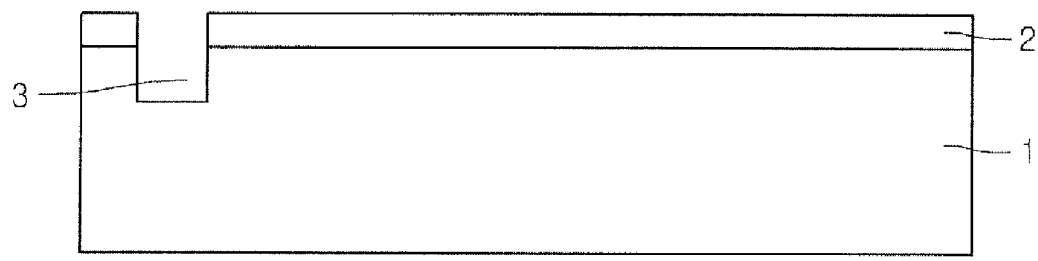
Figure 1C:
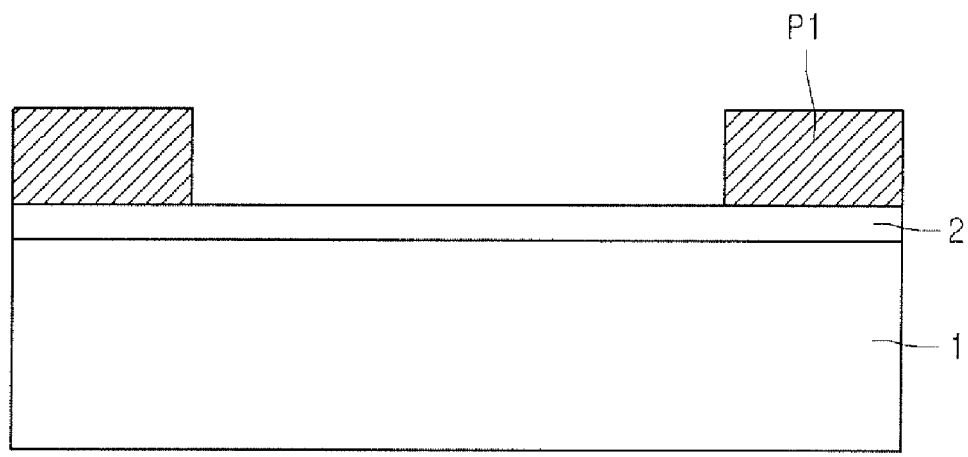
Figure 1D:
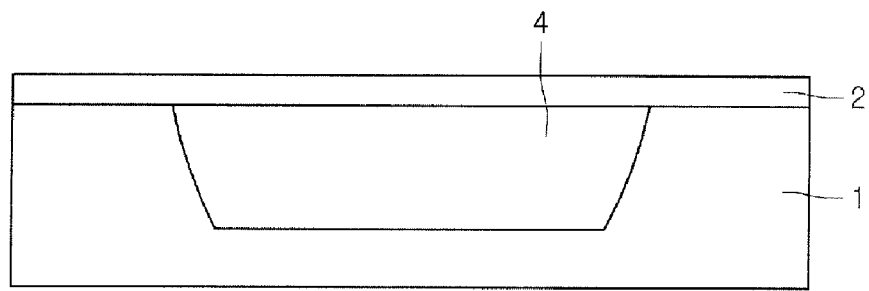
Figure 1E:
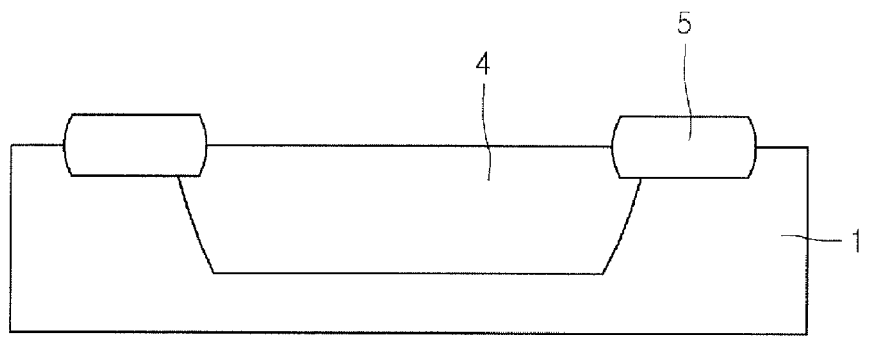
Figure 1F:
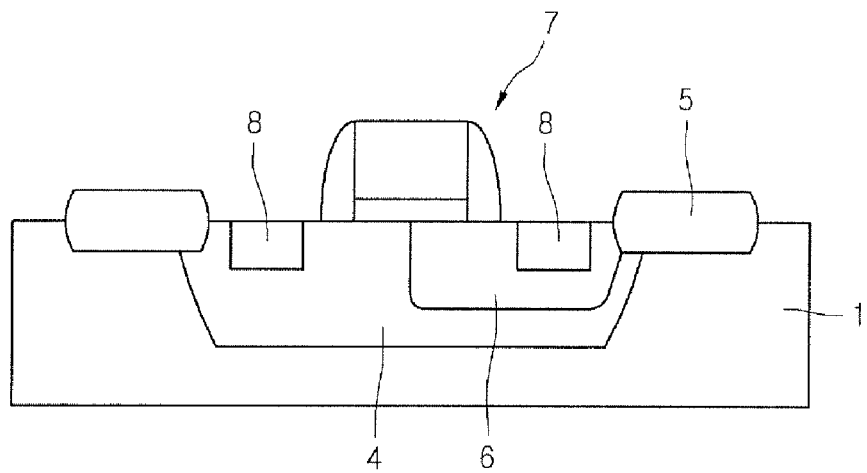
Figure 2A:
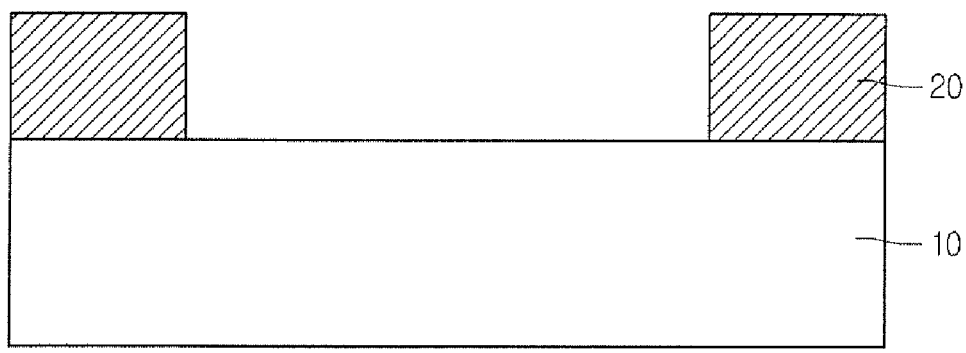
FIGS. 2A to 2F are process views showing a method of fabricating a high voltage CMOS device according to an embodiment of the present invention.

Referring to FIG. 2A, a first oxide film can be formed on a semiconductor substrate 10 doped with impurity ions. At this time, the first oxide film can be formed at a thickness of 3000 Å to 7000 Å, which is thicker compared to the related art. In one embodiment, the first oxide film is formed at a thickness of about 5000 Å. According to embodiments, the semiconductor substrate 10 can be a silicon substrate doped with P-type or N-type impurity ions.

Then, a mask (not shown) can be formed on the first oxide film.

Next, the first oxide film is etched to form a first oxide film pattern 20. A predetermined region of the first oxide film pattern 20 is opened to expose a top surface of the substrate 10. The first oxide film pattern 20 can have a thickness of 3000 Å to 7000 Å (i.e., the thickness of the first oxide film).

Figure 2B:
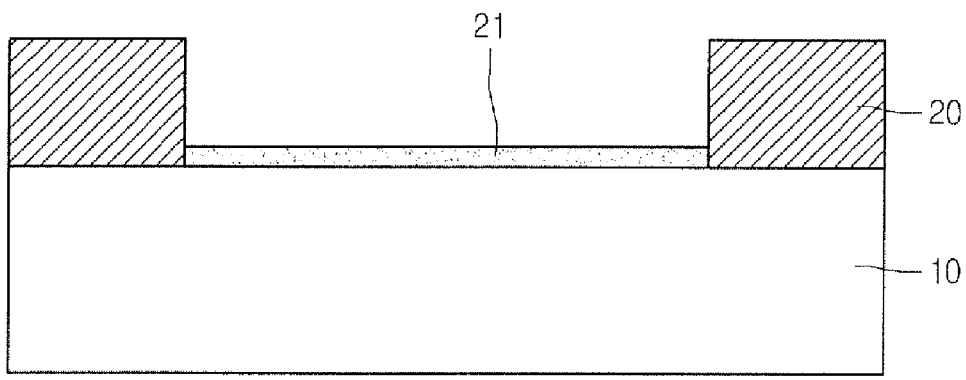

Referring to FIG. 2B, a second oxide film pattern 21 can be formed on the exposed semiconductor substrate 10. The second oxide film pattern 21 can be formed to a thickness of 600 Å to 1000 Å. In one embodiment, the second oxide film pattern 21 is formed to a thickness of about 800 Å.

The second oxide film pattern 21 can be formed by being grown from the exposed semiconductor substrate 10 through an oxidation process.

Figure 2C:
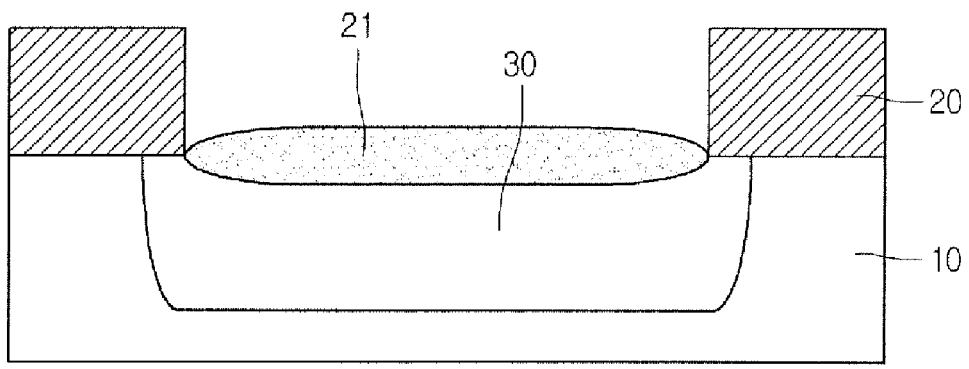

Referring to FIG. 2C, a high voltage deep well region 30 can be formed by performing an impurity ion implant process and an annealing process using the first oxide film pattern 20 as the mask. In this case, the second oxide film pattern 21 expands up and down by means of the annealing process through diffusion. As a result, a step (11 of FIG. 2D) is generated between the bottom of the second oxide film pattern 21 and the top of the high voltage deep well region 30.

Then, the first oxide film pattern 20 is removed.

Figure 2D:
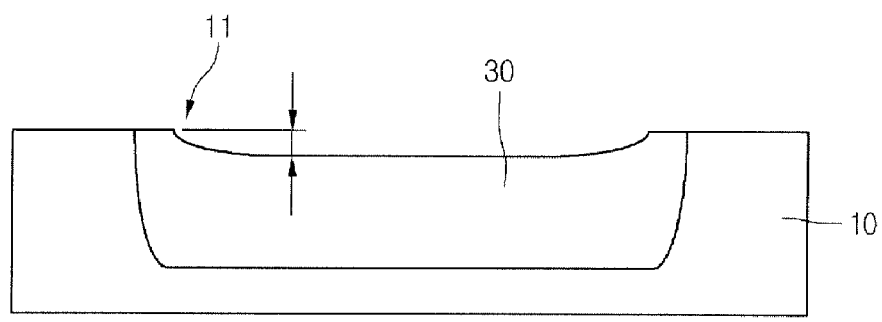

Referring to FIG. 2D, the second oxide film pattern 21 is removed. As a result, a step 11 remains on the surface of the high voltage deep well region 30. According to embodiments of the present invention, the step 11 can be used as a photo align key.

Figure 2E:
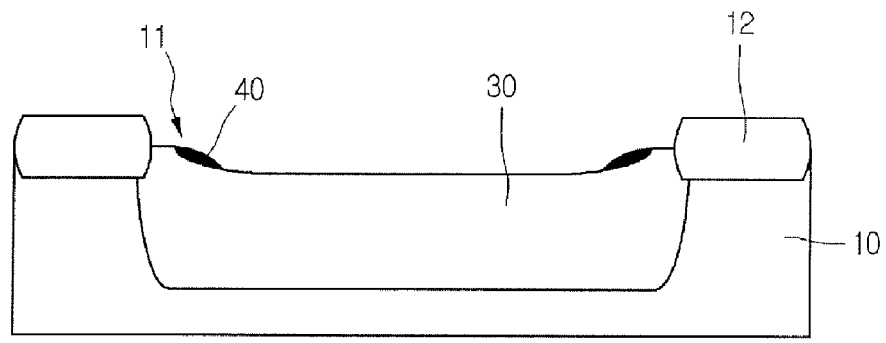

Referring to FIG. 2E, an isolation region 12 can be formed on the semiconductor substrate 10 by performing, for example, a LOCOS process.

An insulating film (not shown) can be formed on the semiconductor substrate 10 including the isolation region 12.

Then, a spacer 40 is locally formed on a step generating region at the step 11 by performing a blanket etch process on the insulating film. In an embodiment, the spacer 40 can be formed of nitride.

Since residues can be generated when performing subsequent processes in the step generating region, for example, subsequent processes of deposition and etching of polysilicon, the spacer 40 is formed in the step generating region so that the generation of the residues by means of the subsequent processes can be inhibited.

Figure 2F:
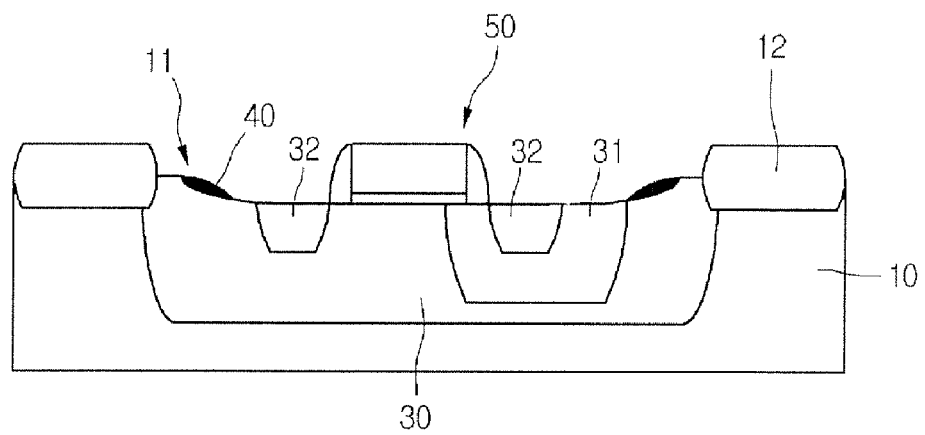

Referring to FIG. 2F, a transistor including a gate structure 50 can be formed between isolation regions 12. In one embodiment, a mask (not shown) can be formed to expose a predetermined region of the semiconductor substrate 10, and a logic well region 31 can be formed by implanting impurity ions using the mask. There after, the mask is removed.

Then, a gate oxide film and polysilicon doped with impurity ions can be stacked and patterned on the semiconductor substrate 10.

A spacer can be formed on the sides of the gate oxide film and the polysilicon by forming an insulating film and performing a blanket etch thereon. Accordingly, the gate structure 50 including the gate oxide film, the polysilicon and the spacer is formed.

A source and drain region 32 is formed by implanting the impurity ions using the gate structure 50 as the mask for implanting ions. Prior to forming the spacer, a process forming a low concentration source and drain region can further be included.

Referring to FIG. 2F, the high voltage CMOS device fabricated according to embodiments described above includes: a semiconductor substrate 10; a high voltage deep well region 30 formed having a step structure 11 on the semiconductor substrate 10; a logic well region 31 formed in the high voltage deep well region 30; an isolation region formed at edge regions of the high voltage deep well region 30; a gate structure 50 formed on the semiconductor substrate 10; and a source and drain region 32 formed on the semiconductor substrate 10 at the sides of the gate structure 50. In addition, a spacer 40 can be formed in the step generating region at the step 11.

Accordingly, with the embodiments described above, the thickness of the second oxide film pattern is thick when forming the high voltage deep well to generate the step on the surface of the high voltage deep well so that the step can be used as the photo align key. Also, since polysilicon residues can be generated on the side of the step due to the step when performing subsequent processes, for example, the deposition and etching processes of polysilicon, a spacer 40 can be formed on the side of the step prior to polysilicon deposition so that the generation of the polysilicon residues can be inhibited.

Therefore, a separate mask for forming the photo align key is not required so that a manufacturing process can be simplified and manufacturing cost can be reduced.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating a high voltage CMOS device, comprising:
   forming a first oxide film pattern on a semiconductor substrate, exposing a predetermined region of the semiconductor substrate;
   forming a second oxide film pattern on the exposed semiconductor substrate; and
   forming a high voltage deep well region by performing an ion implant and an annealing using the first oxide film pattern as an implantation mask,
   wherein the second oxide film pattern diffuses by means of the annealing process to generate a step on a top surface of the high voltage deep well region.

2. The method according to claim 1, further comprising:
   removing the first and second oxide film patterns;
   forming an isolation region on the semiconductor substrate; and
   forming a spacer in a region where the step is generated.

3. The method according to claim 2, wherein the spacer is formed of nitride.

4. The method according to claim 2, further comprising:

forming a logic well in the high voltage deep well region;

forming a gate structure on the semiconductor substrate; and forming a source and drain region on the semiconductor substrate at the sides of the gate structure.

5. The method according to claim 1, wherein the first oxide film pattern is formed to a thickness of 3000 Å to 7000 Å.

6. The method according to claim 5, wherein the first oxide film pattern is formed to a thickness of about 5000 Å.

7. The method according to claim 1, wherein the second oxide film pattern is formed to a thickness of 600 Å to 1000 Å.

8. The method according to claim 7, wherein the second oxide film pattern is formed to a thickness of about 800 Å.

9. The method according to claim 1, wherein the step functions as a photo align key.

* * * * *